(12) United States Patent
Hopf

(10) Patent No.: US 9,380,721 B2
(45) Date of Patent: Jun. 28, 2016

(54) CABLE CLIP FOR MODULE ELECTRONICS

(71) Applicant: SMA Solar Technology AG, Niestetal (DE)

(72) Inventor: Markus Hopf, Espenau (DE)

(73) Assignee: SMA SOLAR TECHNOLOGY AG, Niestetal (DE)

( * ) Notice: Subject to any disclaimer, the term of this patent is extended or adjusted under 35 U.S.C. 154(b) by 61 days.

(21) Appl. No.: 14/528,353

(22) Filed: Oct. 30, 2014

(65) Prior Publication Data
US 2015/0053251 A1     Feb. 26, 2015

Related U.S. Application Data

(63) Continuation of application No. PCT/EP2013/058963, filed on Apr. 30, 2013.

(30) Foreign Application Priority Data

Apr. 30, 2012 (DE) .......................... 10 2012 103 789
Sep. 12, 2012 (DE) ..................... 20 2012 103 480 U

(51) Int. Cl.
| | |
|---|---|
| *H01R 4/24* | (2006.01) |
| *H05K 5/02* | (2006.01) |
| *H01R 9/24* | (2006.01) |
| *H01R 13/52* | (2006.01) |
| *H02S 40/34* | (2014.01) |
| *H05K 5/00* | (2006.01) |
| *H02G 3/16* | (2006.01) |
| *H01R 13/50* | (2006.01) |

(52) U.S. Cl.
CPC ................ *H05K 5/0247* (2013.01); *H01R 4/24* (2013.01); *H01R 4/2433* (2013.01); *H01R 9/2425* (2013.01); *H01R 13/5216* (2013.01); *H02S 40/34* (2014.12); *H05K 5/0004* (2013.01); *H05K 5/0221* (2013.01); *H05K 5/0226* (2013.01); *H01R 13/501* (2013.01); *H02G 3/16* (2013.01)

(58) Field of Classification Search
CPC ... H01R 4/2433; H01R 4/2429; H01R 4/2404
USPC .................................. 439/404, 409, 417, 535
See application file for complete search history.

(56) References Cited

U.S. PATENT DOCUMENTS

| | | | | |
|---|---|---|---|---|
| 3,899,236 A | * | 8/1975 | Santos | H01R 4/2433 439/402 |
| 5,733,139 A | * | 3/1998 | Bray | H01R 12/616 439/402 |
| 5,762,517 A | * | 6/1998 | Abe | H01R 4/2433 439/402 |
| 6,111,201 A | * | 8/2000 | Drane | H01R 4/70 174/92 |

* cited by examiner

*Primary Examiner* — Hien Vu
(74) *Attorney, Agent, or Firm* — Eschweiler & Associates, LLC

(57) ABSTRACT

The disclosure relates to an apparatus including a multi-part housing to be assembled around two lines and conducting a power current generated by a solar module, and an electric circuitry arranged within the housing. The apparatus further includes connection devices for connecting the electric circuitry to the two lines such that at least one component of the electric circuitry is connected in parallel to the solar module. The connection devices include insulation displacement terminals which electrically contact the two lines, and at least one cutting blade made of an electrically insulating material cutting through at least one of the two lines in assembling the multi-part housing.

18 Claims, 4 Drawing Sheets

CABLE CLIP FOR MODULE ELECTRONICS

CROSS REFERENCE TO RELATED APPLICATIONS

The present disclosure is a continuation of International Patent Application PCT/EP2013/058963 filed on Apr. 30, 2013, entitled "Cable Clip for Module Electronics" that claims priority to German Patent Application DE 10 2012 103 789.2, filed Apr. 30, 2012, entitled "Kabelclip für Modulelektronik" and to German Utility Model Application DE 20 2012 103 480.8, filed Sep. 12, 2012, entitled "Kabelclip für Modulelektronik".

FIELD

The present disclosure relates to an apparatus comprising a multi-part housing, an electronic circuitry within the housing and connection devices for connecting the electronic circuitry to two lines conducting a power current generated by a solar module and provided with insulations in such a way that a component of the electric circuitry is connected in parallel to the solar module.

BACKGROUND

As long as light is incident on a solar module, the solar module produces an output voltage potentially exceeding 1000 V DC with present solar modules with regard to ground potential in idle mode. Thus, in case of a damage, like for example a fire, but also with installation and servicing works, there is the danger of electric shock. To avoid this danger, it is known to provide a solar module with an electric circuitry short-circuiting the solar module, if needed.

The implementation of such an electric circuitry with different solar modules, however, is not trivial. Solar modules have different connection boxes and different connectors at the connection boxes or at lines leading out of the connection boxes and conducting the power current generated by the solar module. There is also no standard with regard to operating such an electric circuitry. All these aspects make it particularly difficult to retrofit an existing solar module with such an electronic circuitry.

From WO 2012/012137 A1, a moisture-resistant connection box for a solar module is known comprising a channel for each of two lines provided with insulations, the channel leading into the interior of the connection box, and a further junction running at an angle of 90° thereto. In the area of the channels, the housing is multi-part and clamped onto the respective line in a sealing way in assembling its parts. The further junction provides a pull relief for the respective line introduced into the channel.

From DE 10 2009 024 516 A1, an electric connection box for electrically connecting a solar module is known. This connection box comprises a housing, two input side connection elements for contacting two lines coming from the solar module, and two output side connection elements for connecting external lines, wherein each one of the input side connection elements is connected to one of the output side connection elements within the housing in an electrically conductive way. The connection box is intended to minimize damage to humans by electric shock in case of a fault in that a safety device is provided within the housing. By means of components of the safety device, an electrically conductive cross connection between the input side connection elements can be established such that the output voltage of the solar module present between the input side connection elements is reduced by the cross connection in an active state of the safety device.

Insulation displacement connectors or terminals are known electric connection devices which cut or pierce the insulation of a line and provide an electric connection to the line. According to EP 1 478 053 B1, insulation displacement terminals allow for a retrofitting of plug connectors to existing lines in low voltage applications, like for example on-board grids of vehicles. EP 2 355 268 A1 discloses insulation-displacement terminals for electrically connecting individual solar modules via lines conducting their power current in parallel to two bus bars.

There still is a need for an apparatus by which, for example, safety and protection devices or diagnostic equipment may be implemented in or particularly retrofitted to solar modules without significant effort.

SUMMARY

In one aspect, the present disclosure relates to an apparatus comprising a multi-part housing configured to be assembled around two lines provided with insulations and conducting a power current generated by a solar module, and an electric circuitry arranged within the housing. The apparatus further comprises connection devices configured to connect the electric circuitry to the two lines such that at least one component of the electric circuitry is connected in parallel to the solar module. The connection devices include insulation displacement terminals which are configured to displace the insulations and electrically contact the two lines upon assembly of the housing, and at least one cutting blade made of an electrically insulating material configured to cut through at least one of the two lines upon assembly of the housing. The insulation displacement terminals provided for electrically contacting the at least one of the two lines are arranged on both sides of the cutting blade.

In another aspect, the present disclosure relates to a solar module comprising two lines which conduct a power current generated by the solar module, which lead away from the solar module, and which are provided with insulations, and an apparatus as defined above.

Other features and advantages of the present disclosure will become apparent to one with skill in the art upon examination of the following drawings and the detailed description. It is intended that all such additional features and advantages be included herein within the scope of the present disclosure, as defined by the claims.

BRIEF DESCRIPTION OF THE DRAWINGS

The disclosure can be better understood with reference to the following drawings. The components in the drawings are not necessarily to scale, emphasis instead being placed upon clearly illustrating the principles of the present disclosure. In the drawings, like reference numerals designate corresponding parts throughout the several views.

DETAILED DESCRIPTION

Figure 1:
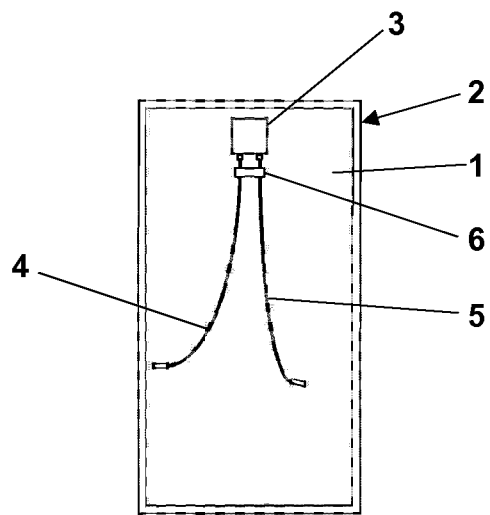
FIG. 1 shows the back side of a solar module with an apparatus which is connected to two lines conducting a power current generated by the solar module.

The present disclosure relates to an apparatus comprising a multi-part housing, an electronic circuitry within the housing and connection devices for connecting the electronic circuitry to two lines conducting a power current generated by a solar module and provided with insulations in such a way that a component of the electric circuitry is connected in parallel to the solar module.

The electric circuitry of the apparatus may have various functions. One of these possible functions is to short-circuit the respective solar module to avoid the occurrence of surges endangering the integrity of the solar module or to remove the danger of an electric shock due to the output voltage of the solar module.

The present disclosure relates to an apparatus having a multi-part housing, an electric, i.e. electrical or electronic, circuitry within the housing and connection devices for connecting the electric circuitry to two lines conducting a power current generated by a solar module and provided with insulations such that at least one component of the electric circuitry is connected in parallel to the solar module. The parts of the housing can be assembled around the lines provided with insulations and continuously running therethrough, and the connection devices include insulation displacement terminals which penetrate the insulations and contact the lines electrically when assembling the housing.

Thus, the apparatus may be very quickly and easily installed to a solar module or to lines leading therefrom. Thus, even retrofitting is possible without any problem. Particularly, there is no dependency on the solar modules of certain manufacturers or from certain sources for providing the electric circuitry. Instead, the manufacturer of a safety device, for example, may optimize the electric circuitry according to his needs, and install it without problem to any solar modules. Although this installation does not take place within the connection box of the respective solar module, it may be very close to the solar cells of the solar module when using the apparatus disclosed here. As compared to common apparatuses with insulation displacement terminals, the insulation displacement terminals in the apparatus disclosed here are arranged in such a way that they are activated by assembling the parts of the housing without a need of special attachment or application tools. This, however, does not exclude that the housing of the apparatus is assembled or closed using a tool to provide increased closing or mating forces, if needed.

The apparatus of the present disclosure is also suitable for such an electric circuitry comprising components to be switched both between the two lines, i.e. in parallel to the solar module, and into at least one of the two lines, i.e. in series with the solar module. For this purpose, a cutting blade made of electrically insulating material is provided for this at least one of the two lines, which cuts through the line when the housing is closed. Insulation displacement terminals are arranged on both sides of the cutting blade to connect the electric circuitry to both ends of the line which are separated after cutting through the respective line. The cutting blade as such may, for example, be made of a ceramic or a hard plastic material.

Generally, the apparatus of the present disclosure does without any pull relief device for the lines as the lines run through the apparatus and thus transfer pulling forces to themselves or support pulling forces by themselves. If, however, a line is cut through when the housing of the apparatus is closed, such pull relief devices may be helpful. They may also be provided to avoid a slipping of the apparatus along the lines or a shearing force acting upon the insulation displacement terminals. Such pull relief devices may force the respective line into a meander shape. The pull relief devices may also provide a bend protection for the respective line running into the housing.

Upon assembly of the housing, the parts of the housing may snap into place with regard to each other and thus fix their assembled arrangement.

In the simplest case, the housing is two-part, i.e. only two parts have to be assembled around the lines.

In any case, the parts of the housing may be connected to each other via joints, particularly solid body joints, or so-called film hinges which eases handling of the parts of the housing prior to their assembly.

The insulation displacement terminals may comprise insulation cutting terminals. These insulation cutting terminals cut the insulations of the lines when closing the housing and—by means of also cutting into the conducting cross-section of the respective line—ensure an electric contact with a sufficient current carrying capacity. It is also possible and may be an advantage if the lines are multi-core or include litz wires that the insulation displacement terminals are made as insulation piercing terminals, particularly as needles. These needles are to be oriented in such a way that they pierce through the insulation and penetrate between the wires of the lines when assembling or closing the housing. In this way, a reduction of the conductor cross-sections of the lines by the insulation displacement terminals is avoided.

In one embodiment, the connection devices of the apparatus which are provided for the two lines are provided at opposite sides of its electric circuitry so that the two lines run through the closed housing at a certain distance to each other. In this way, danger of unintended short-circuits due to a small distance of the locally exposed lines are avoided; and the electric circuitry is spatially arranged between the two lines there, where it shall operate electrically.

The electric lines, which conduct the power current away from a solar module, often extend through the open, i.e. they are subject to any possible environmental influences. To ensure that these environmental influences do not interfere with the connection devices and the electric circuitry even over very long periods of time, the apparatus, in one embodiment, comprises seals which seal the closed housing around the lines so that particularly no moisture may enter the housing.

The seal may particularly seal areas of the closed housing in which the connection devices are located. The electric circuitry as such may be sealed separately in that it, for example, is arranged in a separately and permanently sealed area of the closed housing or potted in.

A reactive sealing mass for forming the seals may be arranged in a reservoir within the housing of the apparatus. This reservoir may be manually opened prior to closing the housing in that, for example, a closure is removed or broken up. Alternatively, parts of the housing may be formed in such a way that, upon assembly of the housing, the reservoir is automatically opened and the sealing mass is pressed out of the reservoir and thus brought to those places where a not only force-fitted but chemically bonded sealing is desired. It is also possible to inject the sealing mass only after closing the housing through an opening of the assembled housing to introduce it into the areas of the desired seals.

A material of the sealing mass may be selected in such a way that it establishes a reliable permanent bond, for example by vulcanization, to the housing and/or the insulations of the electric lines.

In one embodiment, the electric circuitry of the apparatus may comprise a protection or safety circuit for the solar module to, for example, provide a protection against surges and/or to short-circuit the solar module, if needed. In the latter case, the electric circuitry may comprise a short-circuit path between the connection devices which may be closed by means of an external signal. For receiving this external signal, the apparatus may comprise an additional signal line or it may be connected to a signal line. The signal line may be realized as a direct line from a transmitter to one apparatus of the present disclosure as a receiver or as a ring line over a plurality of apparatuses according to the present disclosure. Alternatively, the signal may also be transmitted wirelessly, like for example by a radio signal, or as an electrical signal modulated on the lines.

In further embodiments of the apparatus of the present disclosure, the electric circuitry may alternatively or additionally comprise diagnostic equipment for the solar module to transmit data with regard to the present state of the solar module to an external receiver. This transmission may also be via a signal line or wireless.

In one embodiment of this disclosure, at least two insulation displacement terminals for electrically connecting the electric circuitry are provided for at least one of the two lines, even if this at least one of the two lines is not cut through. The at least two insulation displacement terminals may enhance the quality of the electric contact to the at least one of the two lines, but they may also allow for that an electric contact made by a first one of the insulation displacement terminals causes a current flow between the at least one of the two lines and the electric circuitry, whereas a voltage measured via the electric contact made by a second one of the insulation displacement terminals is not influenced by any voltage drop caused by the current flowing over the electric contact made by the first one of the insulation displacement terminals. The at least two insulation displacement terminals may be arranged in different positions along the main direction of the at least one of the two lines or side by side within one cross-sectional plane of the at least one of the two lines.

In one embodiment of this disclosure, a plurality of needles provided as insulation piercing terminals are laterally offset to each other in such a way an increasing pressure is generated between litz wires and the needles, when the needles penetrate the respective line or cable. This effect may be enhanced by a slightly conical shape of the needles such that the diameter of the penetrating needles increases with increasing penetration depth.

Now referring in greater detail to the drawings, FIG. 1 shows the back side 1 of a solar module 2. A connection box 3 is mounted to the back side 1. Two lines 4 and 5 provided with insulations lead out of the connection box 3. The lines 4 and 5 conduct the power current generated by the solar module 2. An apparatus 6 is installed to the lines 4 and 5 outside the connection box 3. This apparatus 6 will now be further described with reference to the further figures.

Figure 2:
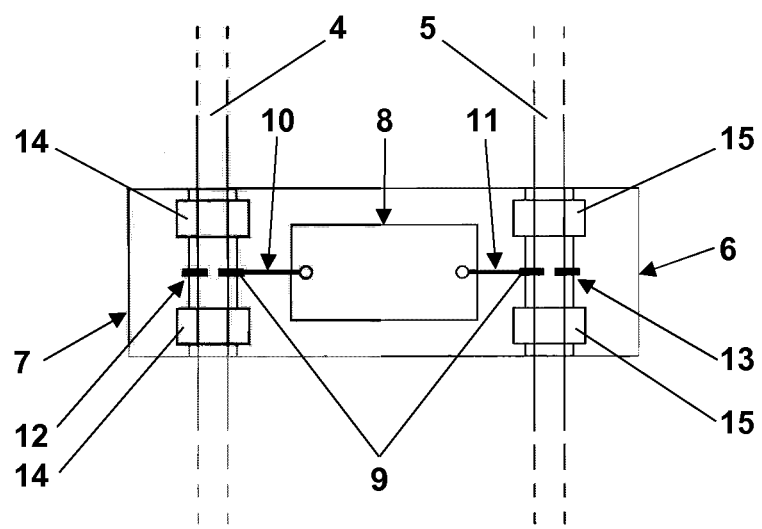
FIG. 2 shows the internal construction of the apparatus according to FIG. 1 in a first embodiment.

FIG. 2 shows an embodiment of the apparatus 6. Within a housing 7 of the apparatus 6, an electric circuitry 8 is provided which is connected to both lines 4 and 5. For this purpose, the apparatus 6, within the housing 7, comprises insulation cutting terminals 9 as insulation displacement terminals which cut through the insulation of the respective line 4 or 5 and electrically contact the electrically conductive portion or conductor of the line 4 or 5. The insulation cutting terminals 9 are part of connection devices 10 and 11 of the apparatus 6, which connect the lines 4 and 5 to the electric circuitry 8. Areas 12 and 13 of the housing 7 are sealed by seals 14 and 15 which—optionally in cooperation with a housing seal (not depicted)—particularly prevent moisture from entering the housing 6 up into the areas 12 and 13. In this way, an installation of the apparatus 6 is achieved that does not affect the insulation properties of the lines 4 and 5 even with regard to moisture, although their insulations are displaced by the insulation cutting terminals 9 within the areas 12 and 13 of the housing 7.

Figure 3:
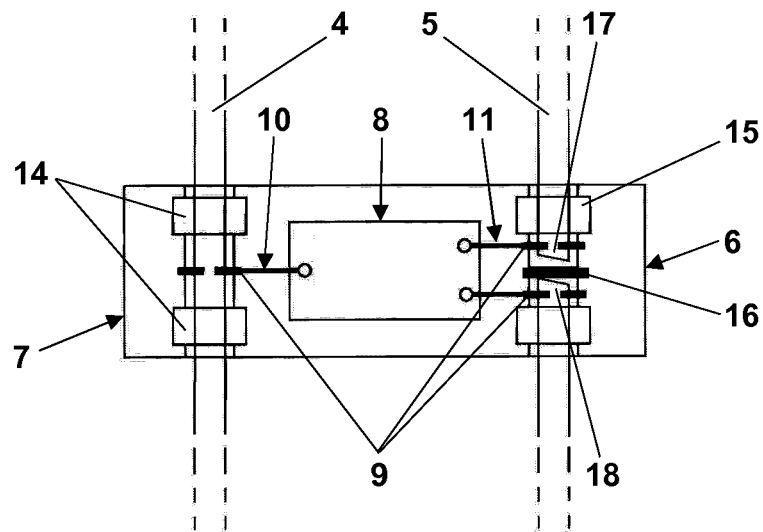
FIG. 3 shows the internal construction of the apparatus according to FIG. 1 in a second embodiment.

FIG. 3 shows an embodiment of the apparatus 6 in which the electric circuitry 8 does not only comprise components switched between the lines 4 and 5, i. e. in parallel to the solar module 2 of FIG. 1, but also includes at least one component connected into the line 5, i.e. in series with the solar module 2 of FIG. 1. For this purpose, the apparatus 6 comprises a cutting blade 16 made of electrically insulating material, which, when assembling or closing the housing 7, cuts through the line 5 and then electrically insulates the separated ends 17 and 18 of the line 5 from each other. The cutting blade 16 may, for example, be made of a ceramic or hard plastic material. Insulation cutting terminals 9 for contacting both free ends 17 and 18 of the line 5 are arranged on both sides of the cutting blade 16.

Figure 4:
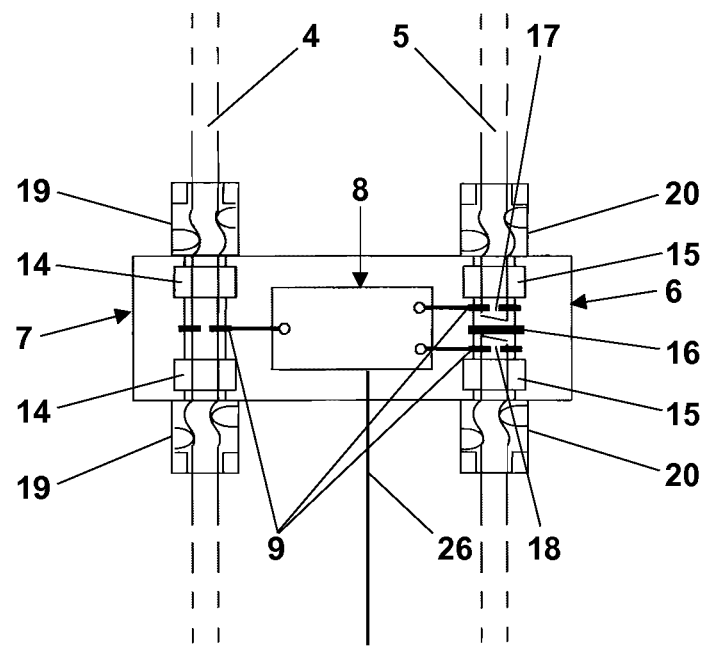
FIG. 4 shows the internal construction of the apparatus according to FIG. 3 with additional pull relief devices.

FIG. 4 shows that the apparatus 6 may also be equipped with pull relief devices 19 and 20 for the two lines 4 and 5 to, particularly with regard to line 5, avoid that the free ends 17 and 18 from being pulled out of the apparatus 6. The lines 4 and 5 run through the pull relief devices 19 and 20 in a meander-shape, and the pull relief devices 19 and 20, at the same time, provide a bend protection for the lines 4 and 5 when entering the apparatus or running out of the apparatus 6. Further, FIG. 4 shows a signal line 26 connected to the electric circuitry 8 and leading out of the housing 7, via which the electric circuitry 8 receives and/or transmits signals. It is to be understood that the feed through of the signal line 26 through the housing 7 will be sealed. Further, a plug connection may be provided within the signal line 26. Particularly, a first section of the signal line 26 may terminate at a socket at the housing 7. The signal line 26 may be a single or multi-conductor line. A signal transmission to or from the electric circuitry may also take place wirelessly or by means of power line communication via the lines 4 and 5.

Figure 5:
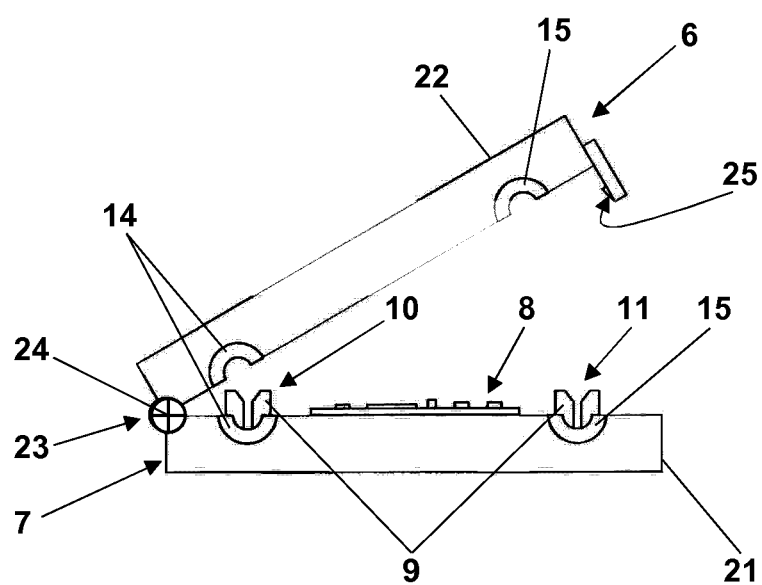
FIG. 5 is a view of a separate apparatus not yet installed to lines with still open housing.

The side view according to FIG. 5 shows an embodiment of the apparatus 6 with a two-part housing 7. In the lower part 21 of the housing 7, the electric circuitry 8 and the insulation cutting terminals 9 plus one half of each of the seals 14 and 15 are provided. In one embodiment the upper part 22 of the housing 7 is hinged to the part 21 via a joint 23 whose axis 24 runs parallel to the lines 4 and 5 which are not depicted here, and has a snap-in projection 25 snapping into place in an assembled position of the parts 21 and 22, i.e. in a closed position of the housing 7, and then fixing this closed position of the housing 7. Upon folding together the two parts 21 and 22 about the joint 23, at first the line 4 not depicted here is pressed into the associated insulation cutting terminal 9 and thus electrically contacted. Then, the line 5 is electrically contacted by the further insulation cutting terminal 9. Upon further closing the housing 7, the seals 14 and 15 seal the lines 4 and 5 and thus also protect the electric circuitry 8 against moisture and other environmental influences. Cutting through one or both of the two lines by one or two cutting blades 16 according to FIGS. 3 and 4 also occurs when the multi-part housing 7 is closed in one embodiment.

Figure 6:
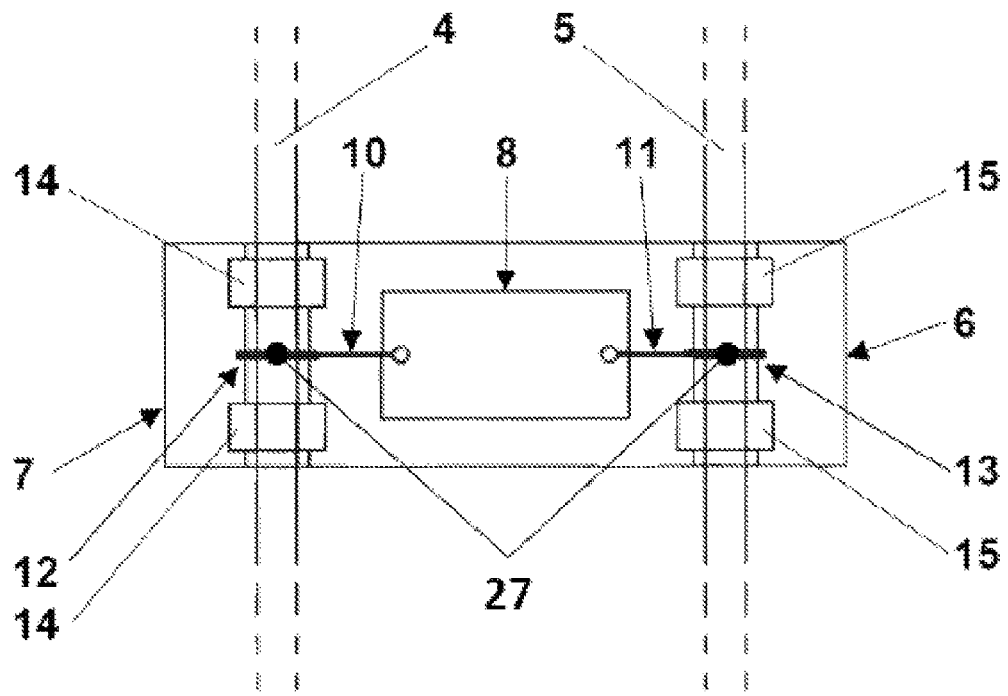
FIG. 6 shows the internal construction of the apparatus according to FIG. 1 in a third embodiment.

FIG. 6 shows an embodiment of the apparatus 6 with needles 27 as insulation displacement or piercing terminals. The needles 27 replace the insulation cutting terminals 9 of FIG. 2, and in the view of FIG. 6 they are oriented normally to the drawing plane. In one embodiment, the needles 27 are centered with regard to the course of the lines 4, 5 to reliably penetrate through their insulations. Instead of replacing the insulation cutting terminals 9, the needles 27 may be provided in addition to the insulation cutting terminals 9 in all embodiments of this disclosure. If both needles 27 and insulation cutting terminals 9 are provided, they may form separate or combined, i.e. directly electrically contacted insulation displacement terminals. The needles 27 may be fixed within the housing 7 such that contacting the lines 4 and 5 takes place prior to or during an assembling of the housing parts 21 and 22. Alternatively, the housing 7 may have openings through which the needles 27 are introduced to contact the lines 4 and 5, after the housing 7 has been closed. For example, the needles 27 may be introduced by pressing or screwing them into the housing 7. This variation may also be applied to the cutting clips 9.

Figure 7:
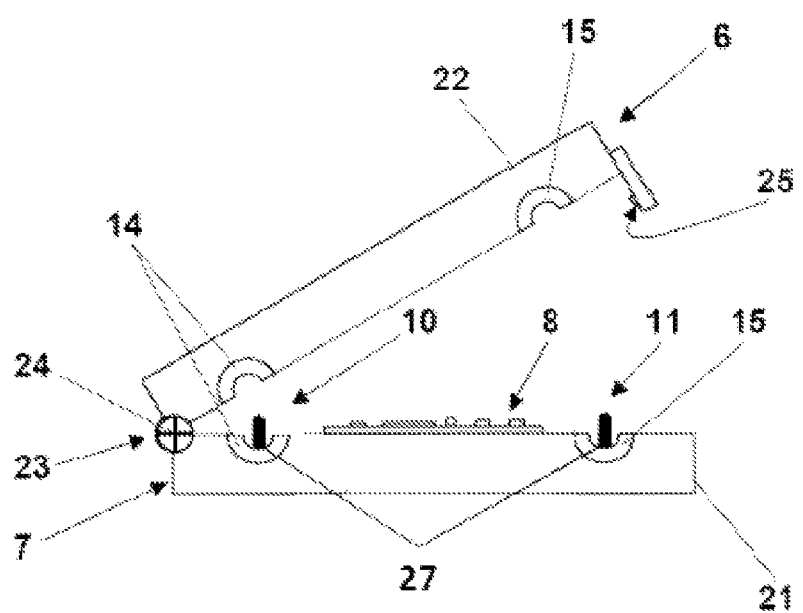
FIG. 7 is a view of a separate apparatus not yet installed to lines with still open housing according to the third embodiment.

The side view according to FIG. 7 shows the embodiment of the apparatus 6 with needles 27 as insulation displacement terminals. Upon folding together the two parts 21 and 22 about the joint 23, at first the line 4 not depicted here is pressed onto the associated needle 27 and thus electrically contacted. Afterwards, the line 5 is electrically contacted by the further needle 27. Upon further closing of the housing 7, the seals 14 and 15 seal the lines 4 and 5 and thus also protect the electric circuitry against moisture and other environmental influences. Cutting through one or both lines with one or two cutting blades 16 according to FIG. 3 or 4 may also be realized in this embodiment, and may take place when closing the multi-part housing 7.

The electric circuitry 8 may particularly be provided for short-circuiting the respective solar module 2 if needed to, for example, avoid danger due to the high output voltage of the solar module 2. The necessity for this is, inter alia, given in case of fire or when servicing the solar module 2 during day time. Alternatively or additionally, the electric circuitry 8 may also be configured to survey the solar module 2 or to diagnose its state and to transmit the result of this survey or diagnosis via the signal line 26 according to FIG. 4 or in a wireless way to a receiver. The diagnosis of the surveyed solar module may, for example, include the determination of at least one of the following characteristic values: a generator voltage of the solar module, a temperature of the solar module, and the presence of an electric arch in the area of the electric lines of the solar module.

Many variations and modifications may be made to the preferred embodiments of the disclosure without departing substantially from the spirit and principles of the disclosure. All such modifications and variations are intended to be included herein within the scope of the present disclosure, as defined by the following claims.

The invention claimed is:

1. An apparatus, comprising:
   a multi-part housing configured to be assembled around two lines, the two lines provided with insulations and configured to conduct a power current generated by a solar module,
   an electric circuitry arranged within the multi-part housing,
   connection devices configured to connect the electric circuitry to the two lines such that at least one component of the electric circuitry is connected in parallel to the solar module, wherein the connection devices include insulation displacement terminals which are configured to displace the insulations and electrically contact the two lines with the electric circuitry upon assembly of the multi-part housing, and
   at least one cutting blade made of an electrically insulating material configured to cut through at least one of the two lines upon assembly of the multi-part housing, wherein the insulation displacement terminals provided for electrically contacting the at least one of the two lines are arranged on opposite sides of the cutting blade.

2. The apparatus of claim 1, wherein parts of the multi-part housing are configured to snap into place upon assembly of the multi-part housing.

3. The apparatus of claim 1, wherein the multi-part housing is a two-part housing.

4. The apparatus of claim 1, wherein adjacent parts of the multi-part housing are connected to each other via a joint or film hinge.

5. The apparatus of claim 1, wherein the insulation displacement terminals comprise insulation cutting terminals.

6. The apparatus of claim 1, wherein the insulation displacement terminals comprise insulation piercing terminals.

7. The apparatus of claim 6, wherein the insulation piercing terminals comprise needles.

8. The apparatus of claim 1, wherein the connection devices provided for the two lines are located on opposite sides of the electric circuitry.

9. The apparatus of claim 1, further comprising seals configured to seal the assembled multi-part housing around the two lines.

10. The apparatus of claim 9, wherein the seals are configured to seal areas of the assembled multi-part housing enclosing the connection devices.

11. The apparatus of claim 1, further comprising a reactive sealing mass in a reservoir within, wherein parts of the multi-part housing are configured to open the reservoir and to press the sealing mass out of the reservoir when assembling the multi-part housing for sealing the assembled multi-part housing around the lines.

12. The apparatus of claim 1, wherein the electric circuitry is arranged in a permanently sealed area of the multi-part housing.

13. The apparatus of claim 1, wherein the electric circuitry includes at least one of a protection circuit, a security circuit and a diagnostic circuit for the solar module.

14. The apparatus of claim 13, wherein the electric circuitry comprises a short-circuit path between the connection devices provided for the two lines which is configured to be closed to establish a short circuit between the two lines by an external signal.

15. The apparatus of claim 1, wherein the electric circuitry is connected to a signal line leading out of the housing.

16. The apparatus of claim 1, wherein at least one pull relief device is provided for at least one of the two lines, the at least one pull relief device configured to force the at least one line in a meander-shape.

17. The apparatus of claim 1, wherein for at least one of the two lines two insulation displacement terminals are provided which are configured to electrically contact a same section of the at least one of the two lines, and which are separately connected to the electric circuitry.

18. A solar module, comprising:
   two lines conducting a power current generated by the solar module, and provided with insulations, and
   an apparatus, comprising:

a multi-part housing configured to be assembled around two lines, the two lines provided with insulations and configured to conduct a power current generated by a solar module, an electric circuitry arranged within the multi-part housing, connection devices configured to connect the electric circuitry to the two lines such that at least one component of the electric circuitry is connected in parallel to the solar module, wherein the connection devices comprise insulation displacement terminals configured to displace the insulations and to electrically contact the two lines with the electric circuitry upon assembly of the multi-part housing, and at least one electrically insulating cutting blade configured to cut through at least one of the two lines upon assembly of the multi-part housing, wherein the insulation displacement terminals provided for electrically contacting the at least one of the two lines are arranged on opposite sides of the cutting blade.

* * * * *